(12) United States Patent
Liu et al.

(10) Patent No.: US 11,368,145 B1
(45) Date of Patent: Jun. 21, 2022

(54) DEGLITCH CIRCUIT FOR A DIFFERENTIAL-SIGNAL-DETECTION CIRCUIT

(71) Applicant: NXP USA, Inc., Austin, TX (US)

(72) Inventors: Xiaoqun Liu, Chandler, AZ (US); Siamak Delshadpour, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/452,413

(22) Filed: Oct. 27, 2021

(51) Int. Cl.
| | |
|---|---|
| H03K 5/00 | (2006.01) |
| H03K 5/1252 | (2006.01) |
| H03K 19/20 | (2006.01) |
| H03K 5/24 | (2006.01) |
| H03K 5/08 | (2006.01) |
| H03K 5/22 | (2006.01) |

(52) U.S. Cl.
CPC ........... *H03K 5/1252* (2013.01); *H03K 5/086* (2013.01); *H03K 5/22* (2013.01); *H03K 5/24* (2013.01); *H03K 5/2472* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 9,319,041 B1 * | 4/2016 | Wang | ................... | H03K 5/2481 |
| 9,360,505 B1 * | 6/2016 | Wang | ....................... | H03G 3/34 |
| 9,490,791 B2 * | 11/2016 | Liu | ........................ | H03K 5/156 |
| 10,432,432 B1 | 10/2019 | Liu et al. | | |
| 10,594,285 B1 | 3/2020 | Delshadpour et al. | | |
| 2007/0030035 A1 * | 2/2007 | Komatsu | ............... | G06F 1/3203 |
| | | | | 327/65 |
| 2008/0165902 A1 * | 7/2008 | Moriwaki | ........... | H04L 25/0272 |
| | | | | 375/340 |
| 2012/0015617 A1 * | 1/2012 | Srivastava | ........... | H03K 5/2481 |
| | | | | 455/218 |
| 2013/0307525 A1 * | 11/2013 | Chen | ...................... | G01R 17/10 |
| | | | | 324/101 |

(Continued)

OTHER PUBLICATIONS

Kawar, Sanad et al.; "A 10 Gbps Loss of Signal Detector for High-Speed AC-Coupled Serial Transceivers in 28nm CMOS Technology"; IEEE International Conference on IC Design & Tecnology Conference Papers; 4 pages (2014).

(Continued)

*Primary Examiner* — Tuan T Lam

(57) ABSTRACT

One example discloses a differential-signal-detection circuit, including: an input stage configured to receive a differential input signal and to output a first differential output signal and a second differential output signal; a first comparator coupled to receive both the first differential output signal and the second differential output signal, and in response generate a first comparator output signal; a second comparator coupled to receive both the first differential output signal and the second differential output signal and generate a second comparator output signal; and an output stage configured to receive the first and second comparator output signals and generate a differential-signal-detection signal; wherein the output stage includes a deglitch circuit configured to attenuate changes in the differential-signal-detection signal during an inter-symbol period of the differential input signal.

17 Claims, 7 Drawing Sheets

(56) References Cited

U.S. PATENT DOCUMENTS

| | | |
|---|---|---|
| 2015/0067209 A1 | 3/2015 | Liu et al. |
| 2018/0183422 A1* | 6/2018 | Yasotharan ...... H03K 3/356139 |
| 2019/0198068 A1* | 6/2019 | Sreeramaneni ...... G11C 7/1078 |

OTHER PUBLICATIONS

Walker, R. et al.; "A 2.488Gb/s Si-Bipolar Clock and Data Recovery IC with Robust Loss of Signal Detection"; International Solid-State Conference, Session 15, Serial Data Communications, Paper FP 15.5; 3 pages (1997).
U.S. Appl. No. 16/933,643; not yet published; 18 pages (filed Jul. 20, 2020).
"Embedded USB2 (eUSB2) Physical Layer Supplement to the USB Revision 2.0 Specification, Revision 1.1"; 158 pages (2018).
U.S. Appl. No. 17/449,776; not yet published; 28 pages (filed Oct. 1, 2021).

\* cited by examiner

DEGLITCH CIRCUIT FOR A DIFFERENTIAL-SIGNAL-DETECTION CIRCUIT

The present specification relates to systems, methods, apparatuses, devices, articles of manufacture and instructions for filtering glitches in differential-signal-detection circuits.

SUMMARY

According to an example embodiment, a differential-signal-detection circuit, comprising: an input stage configured to receive a differential input signal and to output a first differential output signal and a second differential output signal; a first comparator coupled to receive both the first differential output signal and the second differential output signal, and in response generate a first comparator output signal; a second comparator coupled to receive both the first differential output signal and the second differential output signal and generate a second comparator output signal; and an output stage configured to receive the first and second comparator output signals and generate a differential-signal-detection signal; wherein the output stage includes a deglitch circuit configured to attenuate changes in the differential-signal-detection signal during an inter-symbol period of the differential input signal.

In another example embodiment, the output stage is a digital circuit and the deglitch circuit is configured to prevent changes in the differential-signal-detection signal during the inter-symbol period of the differential input signal.

In another example embodiment, the deglitch circuit is configured to generate a current; and the output stage includes a capacitive circuit configured to be charged by the current when both the first and second comparator output signals are below a first threshold signal level.

In another example embodiment, the output stage includes an output configured to carry the differential-signal-detection signal; a deglitch voltage is defined between the capacitive circuit and the output; and the deglitch voltage is below a second threshold signal level during the inter-symbol period.

In another example embodiment, when the deglitch voltage is below the second threshold signal level, then the differential-signal-detection signal is in a first state; and when the deglitch voltage is above the second threshold signal level, then the differential-signal-detection signal is in a second state.

In another example embodiment, the deglitch circuit includes a set of transistors configured as a current mirror.

In another example embodiment, the output stage includes a NOR gate configured to receive both the first and second comparator output signals and the current from the deglitch circuit.

In another example embodiment, the NOR gate is configured to pass the current to the capacitive circuit when both the first and second comparator output signals are below the first threshold signal level.

In another example embodiment, a deglitch voltage is defined between the capacitive circuit and the output; and the capacitor is configured to attenuate the deglitch voltage during the inter-symbol period of the differential input signal.

In another example embodiment, the output stage includes a NOR gate configured to discharge the capacitive circuit when either of the first and second comparator output signals are above the first threshold signal level.

In another example embodiment, the input stage includes a first transistor coupled to receive a first polarity of the differential input signal, and a second transistor coupled to receive a second polarity of the differential input signal; the input stage includes a first current source coupled to the first transistor a first input of each the first comparator and the second comparator; and the input stage includes a second current source coupled to the second transistor a second input of each the first comparator and the second comparator.

In another example embodiment, the input stage includes a first resistance coupled between the first transistor and the first current source; and the input stage includes a second resistance coupled between the second transistor and the second current source.

In another example embodiment, the first resistance and the second resistance are variable resistances.

In another example embodiment, the first and second resistances are variable in response to a controller signal.

In another example embodiment, the differential-signal-detection circuit is embedded in a squelch-detector; and a first state of the differential-signal-detection signal corresponds to an un-squelched state, and a second state of the differential-signal-detection signal corresponds to a squelched state.

In another example embodiment, the differential-signal-detection circuit is embedded in a disconnect-detector; and a first state of the differential-signal-detection signal corresponds to a connected state, and a second state of the differential-signal-detection signal corresponds to a disconnected state.

In another example embodiment, the differential-signal-detection circuit is embedded in a repeater-circuit; and the differential input signal is either an eUSB or USB signal.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figures 1A, 1B:
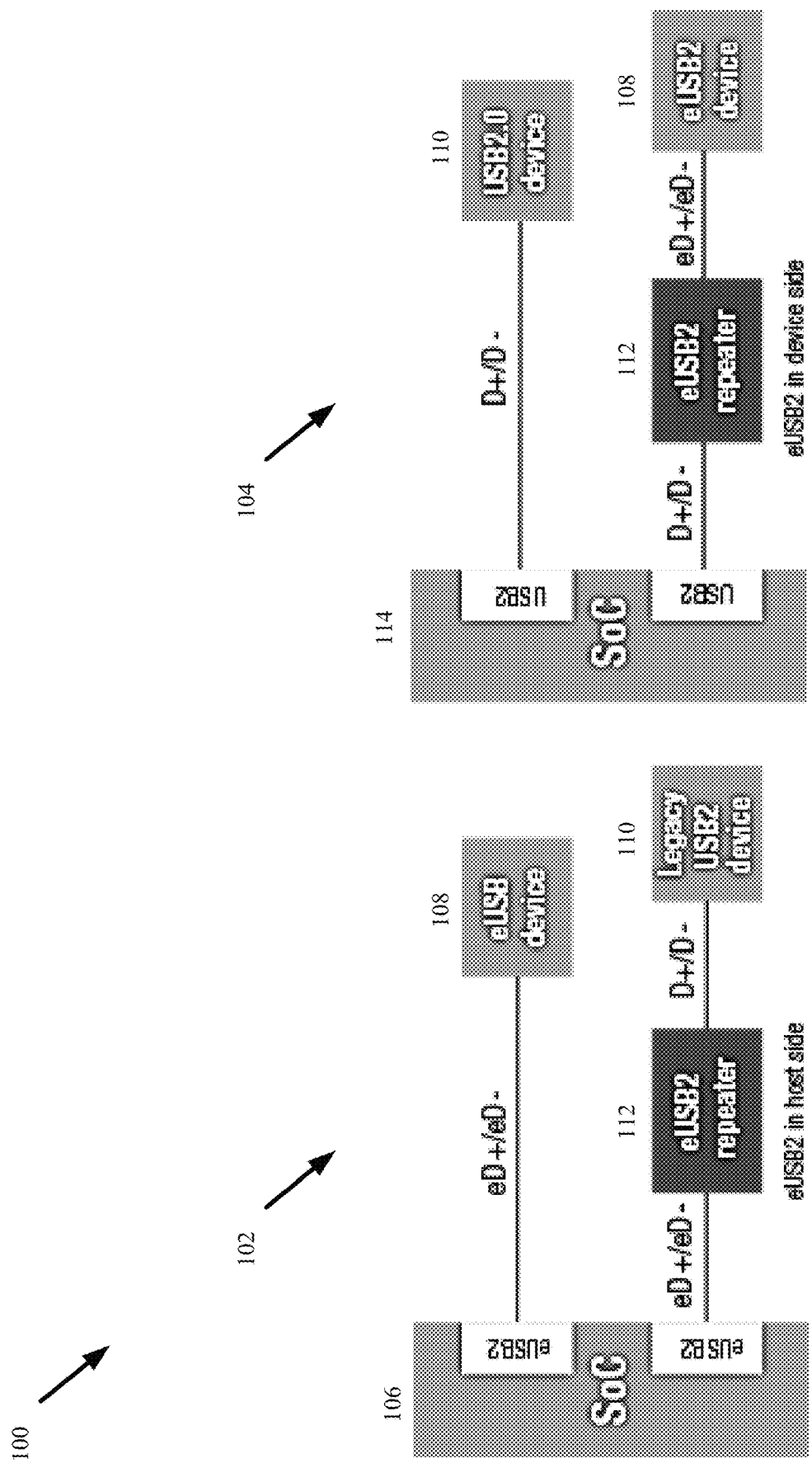
FIGS. 1A and 1B represents examples of two eUSB/USB2 configurations.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

USB (e.g. v2.0) has been one of the most successful wired interfaces in the past 20 years, and almost all SoCs today are equipped with a USB 2.0 interface. USB standards evolution kept the original 3.3V I/O USB 1.0 interface intact for backward compatibility, helping enable wider adoption and a larger ecosystem while also preserving device interoperability. However, as process nodes approach more advanced node (e.g. 5 nm), the manufacturing cost to maintain USB 2.0 3.3V I/O signaling has grown exponentially.

Embedded USB2 (eUSB2) is a supplement specification to the USB 2.0 specification that addresses issues related to interface controller integration with advanced system-on-chip (SoC) process nodes by enabling USB 2.0 interfaces to operate at I/O voltages of 1V or 1.2V instead of 3.3V. eUSB2 can enable smaller, more power-efficient SoCs, in turn enabling process nodes to continue to scale while increasing performance in applications such as smartphones, tablets and notebooks. In some examples, designers integrate the eUSB2 interface at a device level while leveraging and reusing the USB 2.0 interface at a system level. eUSB2 can support onboard inter-device connectivity through direct connections as well as exposed connector interfaces through an eUSB2-to-USB 2.0 repeater.

FIGS. 1A and 1B represents examples 100 of two eUSB/USB configurations 102, 104. The first configuration 102 includes a system on a chip (SoC) having two eUSB embedded interfaces (as shown). The chip 106 is configured to be coupled to an external eUSB device 108 and to a legacy USB2 device 110. An eUSB2 repeater 112 is necessary to convert a differential eUSB signal (eD+/eD−) to a differential USB signal (D+/D−). The eUSB2 repeater 112 in some examples is on a same PC board as the chip 106, while the eUSB 108 and USB 110 devices are coupled via cabling.

The second configuration 104 is substantially similar to the first configuration 102, except now an SoC 114 includes two USB2 embedded interfaces (as shown).

The eUSB/USB circuits 106, 108, 110, 112, 114 in various example embodiments require differential-signal-detection of some sort, either for squelch detection, disconnect detection, or for some other reason. For example, in some eUSB/USB2 bidirectional high-speed repeaters, squelch detectors in both eUSB and USB2 sides are required, and a disconnect detector in the USB2 side is required.

The squelch detectors can be used to wake high-speed receivers within these circuits 106, 108, 110, 112, 114 from a power-saving mode when communications activity is detected from another USB device. For example, when the USB2 to eUSB path is needed, the USB2 (squelch detector) SQD will be enabled and the repeater will be enabled after detection of incoming signal by USB2 SQD. When the eUSB to USB2 path is needed, the eUSB SQD will be enabled and the repeater will be enabled after detection of incoming signal by eUSB SQD.

Squelch detectors can also be used to indicate whether communications data is invalid, such as when an amplitude of a received differential signal falls below a fixed squelch threshold.

After these circuits 106, 108, 110, 112, 114 are enabled and using the communications channel to exchange data with other devices, the disconnect detector (DCD) can be used to detect any absence, disconnect, or detached peripheral device during active channel use. Disconnect detection may also be required within downstream facing ports for detecting the disconnect state on the line.

Figure 2:
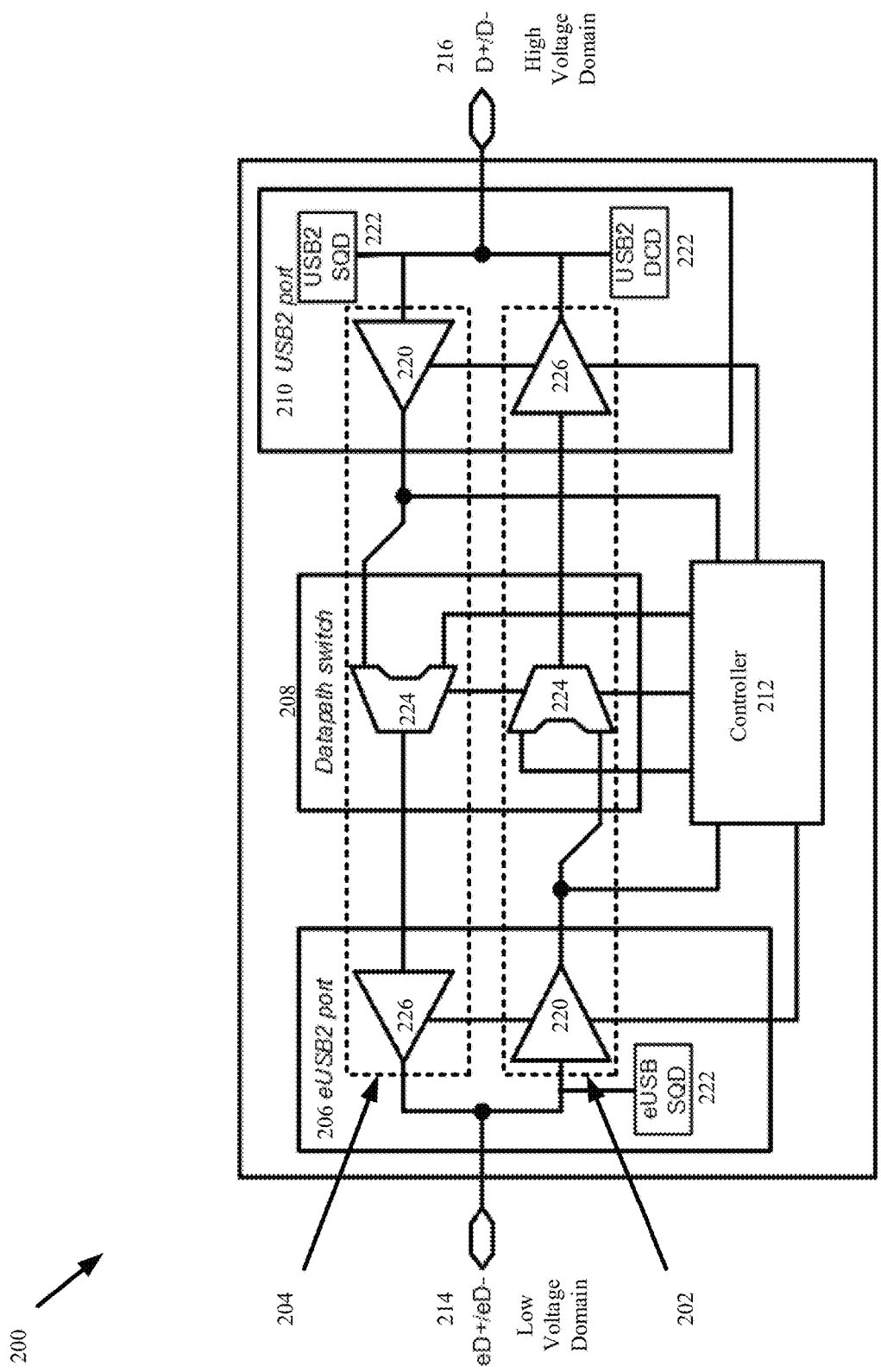
FIG. 2 is an example bi-directional eUSB/USB2 repeater including a set of differential-signal-detection circuits.

FIG. 2 is an example 200 bi-directional eUSB/USB repeater including a set of differential-signal-detection circuits 222. This example repeater follows the first configuration 102 example in FIG. 1A, but in another example embodiment could follow the second configuration 104 in FIG. 1B.

The repeater 200 includes a transmit datapath 202, a receive datapath 204, an eUSB2 port 206, a datapath switch matrix 208, a USB2 port 210, and a controller 212. The repeater 200 is configured to be coupled to differential eUSB signals (eD+/eD−) 214 in a low voltage domain, and differential USB signals (D+/D−) 216 in a high voltage domain. In various example embodiments, a Vdd of 1.8V powers the eUSB port 206 and a Vdd of 3.3V powers the USB2 port 210.

The transmit and receive datapaths 202, 204 are substantially similar and include: a slicer 220, a datapath switch 224, and a line-driver 226. The datapaths 202, 204 in various embodiments also include (not shown) a continuous time linear equalizer (CTLE), a feed forward equalizer (FFE) for removing most intersymbol interference (ISI), input and termination resistors (RT). RT can be different for different standards (e.g. for an USB2 to an eUSB repeater, input RT=45Ω, output RT=40Ω).

The slicer 220 makes a (non-linear) hard decision and makes the data signal either high or low, which avoids propagation of amplitude noise and allows regeneration of pre-emphasis. The data signal after the slicer 220 and before the line driver 226 is in either the lower voltage domain (e.g. 1.8V) or the high voltage domain (e.g. 3.3V), depending upon the datapath 202, 204.

As shown, the eUSB2 port 206 includes one of the differential-signal-detection circuits 222 configured as an eUSB squelch detector (SQD). Also as shown, the USB2 port 210 includes two differential-signal-detection circuits 222, one configured as a USB2 squelch detector (SQD) and one configured as a USB2 disconnect detector (DCD) as shown.

In various example embodiments of an eUSB/USB2 bidirectional high-speed repeater, two of the differential-signal-detection circuits 222 are configured as squelch detectors on both the eUSB and the USB2 side. Also, one differential-signal-detection circuit 222 is configured as a disconnect detector on the USB2 side to detect high-speed differential signals. Thus when a differential signal amplitude on either the eUSB2 port 206 or the USB2 port 210 is higher than a preprogrammed detection threshold, such differential signal will be detected as "un-squelched" by the squelch detector, or as "disconnected" by the disconnect detector, and vice versa.

Not that while the differential-signal-detection circuits 222 show only one differential input connection, each of the differential-signal-detection circuits 222 are configured to receive both differential input connections and generate a detection output sent to the controller 212.

In some example embodiments, both the SQD and DCD work in the 480 Mbps range but support different functionalities. The squelch detector is needed to detect any activity on USB2.0 channels before enabling high-speed receivers. The squelch detector is also used to indicate that data is invalid ("squelched") when an amplitude of a differential input signal at the receiver's inputs falls below a preprogrammed squelch threshold. The squelch detector is also used to indicate that data is valid ("un-squelched") when an amplitude of the differential input signal at the receiver's inputs is higher than the preprogrammed squelch threshold.

eUSB and USB2 specs require very fast "squelched" and "un-squelched" detection times. For example when the USB2 to eUSB path is needed, the USB2 SQD will be enabled so that when the incoming signal level is higher than the squelch threshold, the repeater will be enabled after detection of "un-squelched" by USB2 SQD (which needs to be detected in 4.167 nS (2 UI)). When the incoming signal goes to idle or lower than the squelch threshold, the repeater will be disabled after detection of "squelched" by USB2 SQD (which needs to be detected in 6.25 nS (3 UI)).

Similarly, when the eUSB to USB2 path is needed, the eUSB SQD will be enabled so that when the incoming signal level is higher than the squelch threshold, the repeater will be enabled after detection of "un-squelched" by eUSB SQD (which needs to be detected in 4.167 nS (2 UI)). When the incoming signal goes to idle or lower than the squelch threshold, the repeater will be disabled after detection of "squelched" by eUSB SQD (which needs to be detected in 6.25 nS (3 UI)). When the repeater is enabled and signal is passing, USB2 DCD is enabled to detect any disconnect condition. Disconnect needs to be detected in 20 nS.

However, due to inherent timing and threshold variations in various differential circuits, such as the SQD and DCD circuits, output glitches can be generated during differential signal transitions and/or differential signal level variations in the differential input signals. For example, when an SQD is in "un-squelched" or a DCD is in a "disconnected" state, during a inter-symbol transition of an incoming high speed signal, when both signals from the comparator stage have an amplitude lower than a detection threshold, a glitch may be generate at the output stage.

Figure 3:
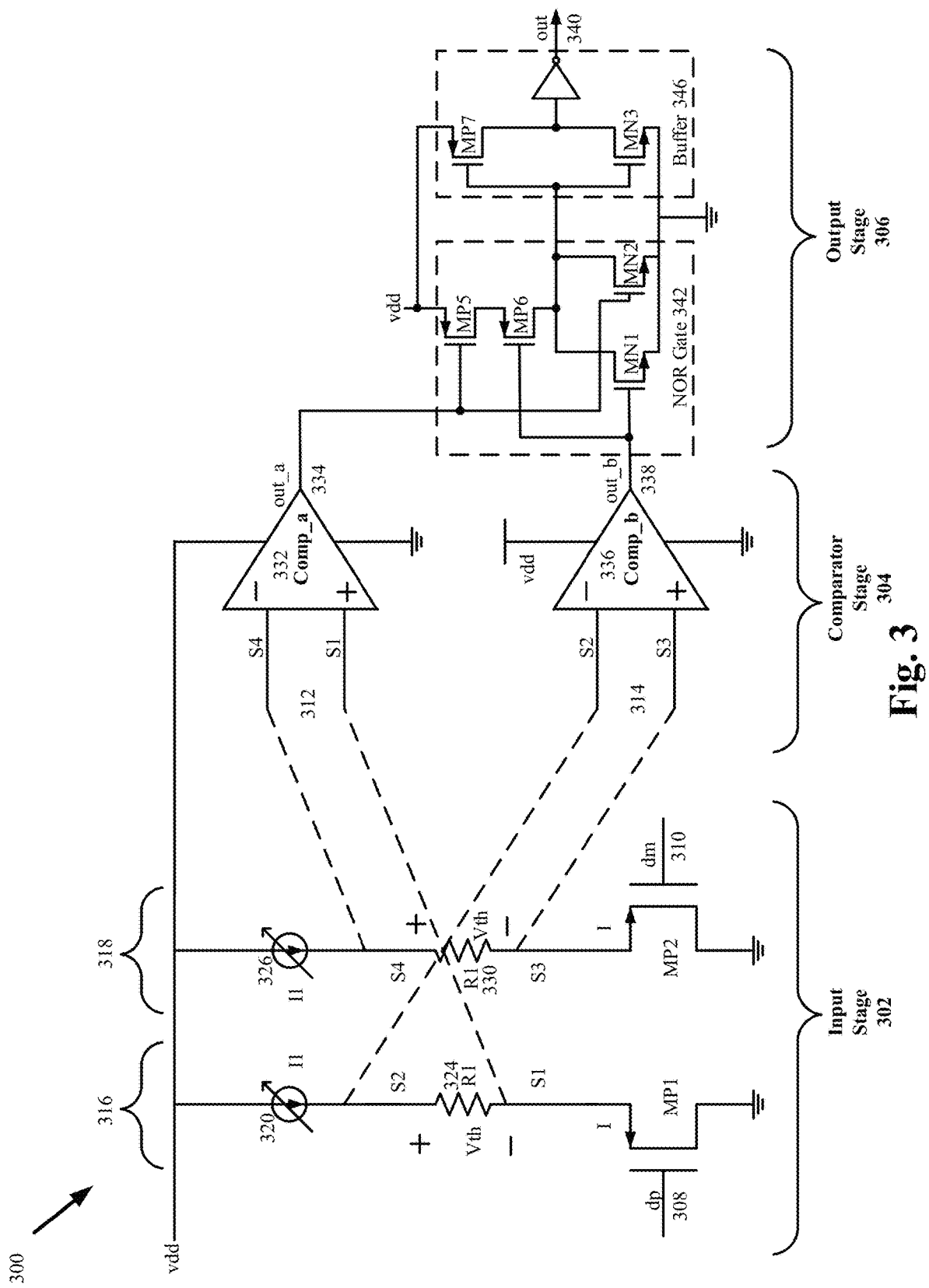
FIG. 3 is an example differential-signal-detection circuit without a deglitch circuit.

FIG. 3 is an example 300 differential-signal-detection circuit without a deglitch circuit. The differential-signal-detection circuit 300 includes: an input stage 302, a comparator stage 304, and an output stage 310.

The input stage 302 is configured to receive differential input signal 308, 310 (dp (data-plus input) and dm (data-minus input)) and generate a first differential output signal 312 and a second differential output signal 314.

The input stage 302 includes a first path 316 and a second path 318. The first path 316 includes a detection current source (I1) 320, a resistance (R1) 324, and a transistor (MP1). The second path 318 includes a detection current source (I1) 326, a resistance (R1) 330, and a transistor (MP2). Transistors MP1 and MP2 are shown as PMOS, but could be NMOS or of another type in a circuit which follows the same design principals.

The comparator stage 304 includes a first comparator 332 configured to receive the first differential output signal 312 and generate a first single-ended output signal 334, and a second comparator 336 configured to receive the second differential output signal 314 and generate a second single-ended output signal 338.

The output stage 306 is configured to receive the first and second single-ended output signals 334, 338 and generate a differential-signal-detection signal at an output 340. The output stage 306 includes a NOR gate 342 and a buffer 346. In some example embodiments, the output stage 310 buffer 346 is sized for driving additional circuits (not shown), but in other example embodiments may be omitted.

The detection threshold voltage (Vth) across R1 324, 330 in each path 316, 318 results from the detection current source I1 320, 326 current passing through these resistances R1 324, 330. The detection threshold voltage "Vth=(n*Vbg/R)*R1", where "n" is a variable integer, Vbg is an bandgap reference voltage, R is an internal equivalent resistance of the current source (I1) 320, 326, and R1 is a circuit resistance as shown.

Figure 4:
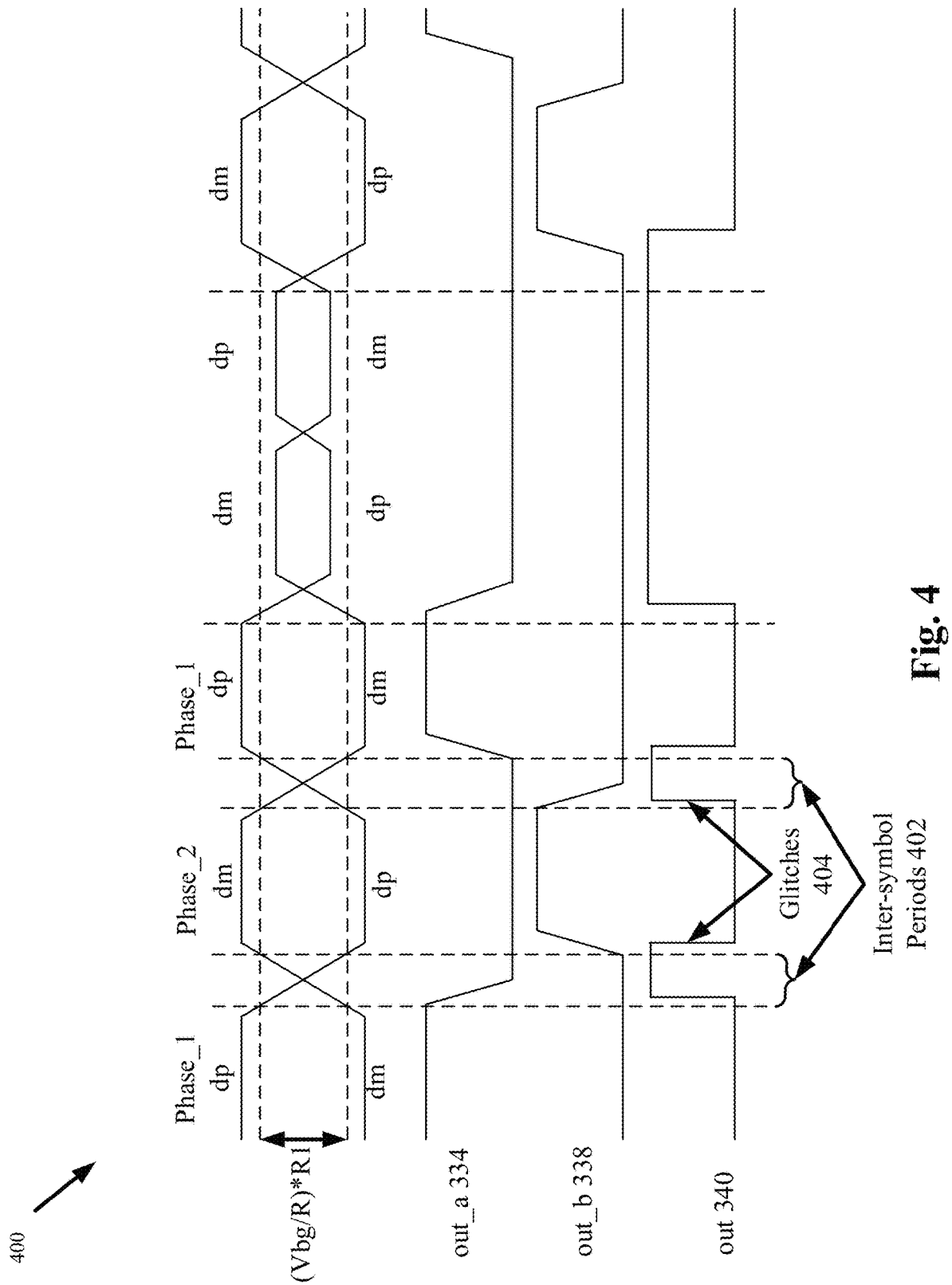
FIG. 4 is an example set of operational waveforms for the differential-signal-detection circuit without a deglitch circuit.

FIG. 4 is an example 400 set of operational waveforms for the differential-signal-detection circuit 300 without a deglitch circuit. As shown in FIG. 4, if there is no deglitch circuit, then during an inter-symbol period 402, dp−dm<Vth, and dm−dp<Vth. As a result a voltage at node S1 is lower than voltage at node S4, and a voltage at node S3 is lower than voltage at node S2. At such a time both out_a 334 and out_b 338 are logic low and glitches 404 are generated on out 340 (i.e. out 340 undesirably transitions to logic high ("1")). Such glitches 404 inaccurately indicate a squelched state when in reality there isn't one.

Now discussed are various example embodiments of differential-signal-detection circuits including a deglitch circuit. The deglitch circuit prevents undesirable output transitions during inter-symbol periods. The deglitch circuit provides uses a current generator to compensate for a spread of a logical trip point of a differential-signal-detector output stage across PVT (process, supply voltage and temperature). The deglitch circuit discussed below also substantially damps glitches during inter-symbol periods when the differential-signal-detector circuit is in an un-squelch state. The deglitch circuit provides high speed and high accuracy and a short response time.

Figure 5:
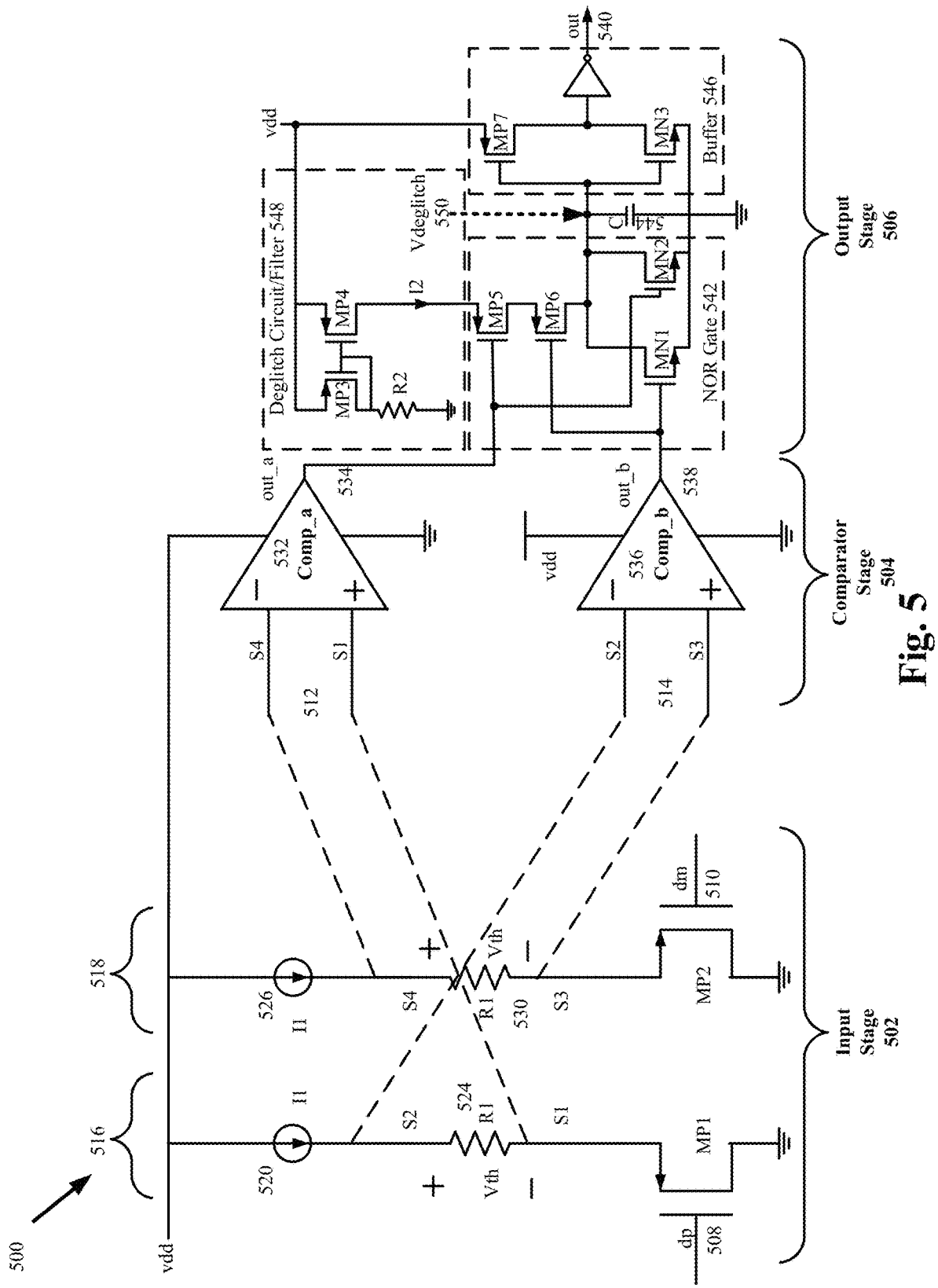
FIG. 5 is a first example differential-signal-detection circuit including a deglitch circuit.

FIG. 5 is a first example 500 differential-signal-detection circuit including a deglitch circuit. The differential-signal-detection circuit 500 includes: an input stage 502, a comparator stage 504, and an output stage 510.

The input stage 502 is configured to receive differential input signal 508, 510 (dp (data-plus input) and dm (data-minus input)) and generate a first differential output signal 512 and a second differential output signal 514.

The input stage 502 includes a first path 516 and a second path 518. The first path 516 includes a detection current source (I1) 520, a resistance (R1) 524, and a transistor (MP1). The second path 518 includes a detection current source (I1) 526, a resistance (R1) 530, and a transistor (MP2). Transistors MP1 and MP2 are shown as PMOS, but could be NMOS or of another type in a circuit which follows the same design principals.

The detection threshold voltage (Vth) across R1 524, 530 in each path 516, 518 results from the detection current source I1 520, 526 current passing through these resistances R1 524, 530. The current source's 520, 526 current I1 is equal to Vbg/R, where Vbg is an accurate bandgap voltage reference. I1 goes through R1 to generate the detection threshold voltage (Vth). Vth=(Vbg/R)*R1=Vbg*(R1/R), where R1/R is a constant number determined by design.

In some example embodiments the resistances (R1) 524, 530 are variable and can be changed by the controller 212 to vary the detection threshold voltage (Vth) since Vth=I1*R1 in both the first path 516 and the second path 518 of the input stage 502. In some example embodiments, varying resistances (R1) 524, 530 will include switches which can have parasitic resistance and affect an accuracy of R1, that in turn can affect an accuracy of the detection threshold voltage (Vth). Such switches may also have a parasitic capacitance that can affect the differential-signal-detection circuit's 500 operational speed.

The comparator stage 504 includes a first comparator 532 configured to receive the first differential output signal 512 and generate a first single-ended output signal 534, and a second comparator 536 configured to receive the second differential output signal 514 and generate a second single-ended output signal 538.

The output stage 506 is configured to receive the first and second single-ended output signals 534, 538 and generate a differential-signal-detection signal at an output 540. The output stage 506 includes a NOR gate 542, a capacitor 544, a buffer 546 and a deglitch circuit 548 (e.g. glitch filter). In some example embodiments, the output stage 510 buffer 546 is sized for driving additional circuits (not shown), but in other example embodiments may be omitted.

The deglitch circuit 548 includes a current generator that consists of resistor R1 and transistors MP3, MP4. Transistors MP3 and MP4 are current mirror with ratio of "m:n" where "m" and "n" are determined by design. In the calculation, we assume that m=n=1 for simpler discussion, then current "I2=(vdd−Vsg)/R2, where Vsg=abs(Vthp)+sqrt(2*I/(μp*Cox*(W/L)))", where pp is a mobility of the transistor, and Cox is a gate oxide capacitance per unit area of the transistor, and W is a channel width while L is a channel length of the transistor. In some example embodiments the deglitch circuit 548 also includes the capacitor (C) 544.

Figure 6:
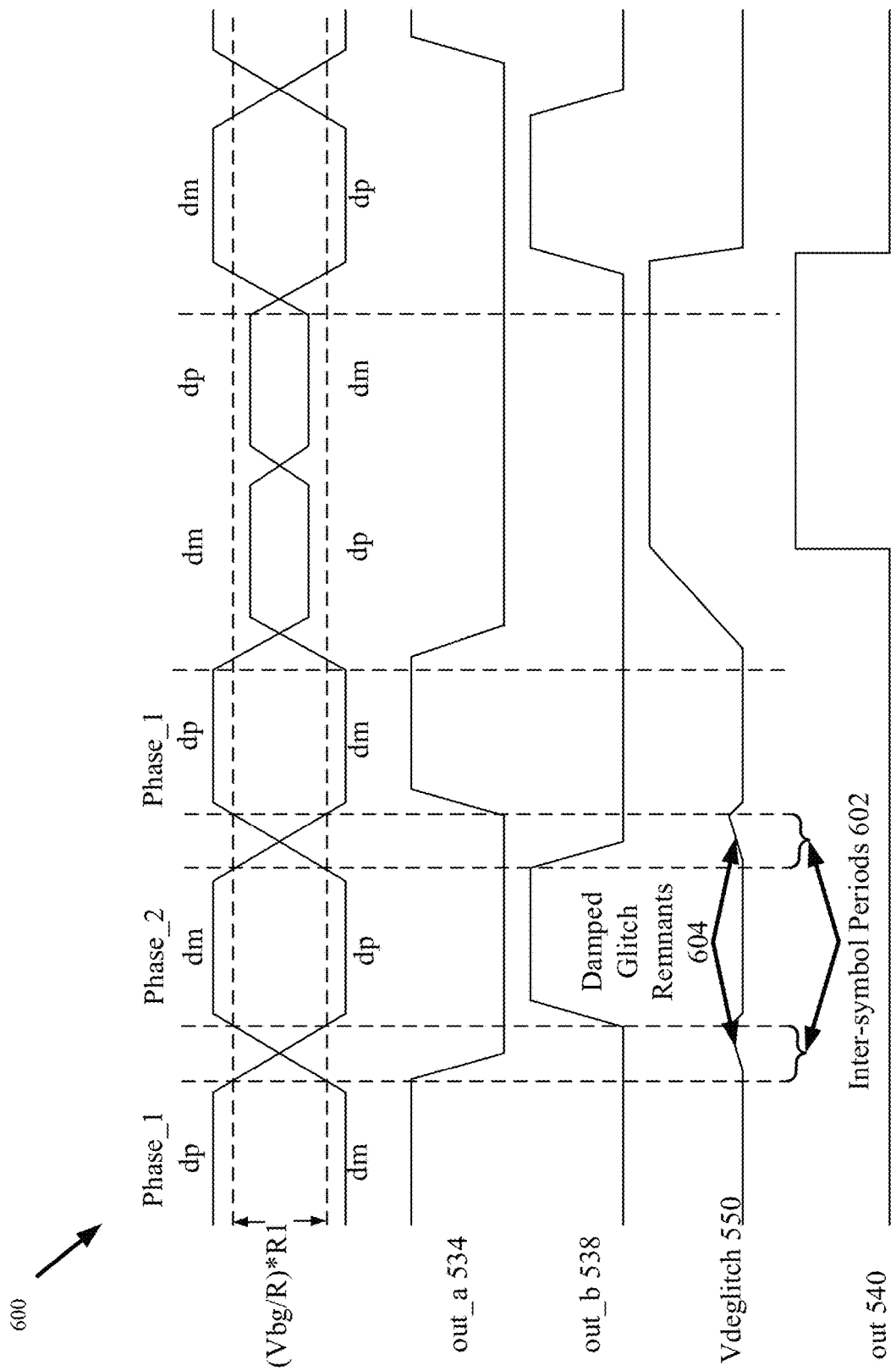
FIG. 6 is an example set of operational waveforms for the first differential-signal-detection circuit including the deglitch circuit.

FIG. 6 is an example 600 set of operational waveforms for the first differential-signal-detection circuit 500 including the deglitch circuit 548. The example waveforms 600 show at least two inter-symbol periods 602 and corresponding damped glitch remnants 604.

During a detection phase, if input signal amplitude 508, 510 is higher than Vth (i.e. dp−dm>Vth), then voltage at node S1 is higher than voltage at node S4, and out_a 534 is logic high ("1") and out 540 is logic low ("0"). This means that the signal is un-squelched. Similarly, if dm−dp>Vth, then voltage at node S3 is higher than voltage at node S2, and out_b 538 is logic high ("1) and out 540 is logic low ("0"). This means that the signal is un-squelched.

However, if the input signal amplitude 508, 510 is lower than Vth (i.e. dp−dm<Vth, or dm−dp<Vth), then voltage at node S1 is lower than voltage at node S4, and voltage at node S3 is lower than voltage at node S2, and thus both out_a 534 and out_b 538 are logic low and out 540 is logic high ("1"). This means the input signal is squelched.

During the inter-symbol period 602, when both out_a 534 and out_b 538 are low, MP5, MP6 are on and MN1, MN2 are off. I2 starts to charge capacitor C 544. A deglitch voltage (Vdeglitch) 550 is defined at the capacitor C 544. Vdeglitch=I2*t/C=(vdd−Vsg)*t/(R2*C).

In a digital example embodiment, as long as Vdeglitch 550 is lower than a trip voltage (Vtrip), which is a digital trip point of an inverter consisting of MP7 and MN3, then the output of the inverter remains high and out 540 remains low and glitches are avoided (i.e. only the damped glitch remnants 604 remain). In an analog example embodiment, the trip voltage is a threshold signal level (e.g. a detection threshold voltage).

In various USB/eUSB applications, according to a receiver waveform template of eUSB and USB2 specs, a maximum inter-symbol time 602 is: Tmax=1.25 nS. Also, the maximum voltage of Vdeglitch 550 across PVT is: Vdeglitch=I2*Tmax/C<Vtrip. That is (Vtrip/I2)*C>1.25 nS.

As described before, when the incoming signal 508, 510 goes from active to idle or goes from higher than threshold to lower than threshold, the differential-signal-detector circuit 500 needs to detect a "squelched" state. The response time of "squelched" detection is required to be less than 3 UI across PVT, that is: (Vtrip/I2)*C<6.25 nS.

The deglitch circuit 548 meets these USB/eUSB timing constraints if: 1.25 nS<(Vtrip/I2)*C<6.25 nS. However since Vtrip, I2, and C can vary across PVT during differential-signal-detector circuit 500 fabrication, the USB/eUSB timing constraints may not always be satisfied.

To address these PVT variations, the transistor W/L of the PMOS device MP7 can be designed to be much larger than W/L of NMOS device MN3. With such a design, Vtrip will be approximately equal to: vdd−abs(Vthp). Moreover, since I2 is generated by MP3 and R2, and current is equal to "I2=(vdd−Vsg)/R2, then: (Vtrip/I2)*C=((vdd−abs(Vthp))/(vdd−Vsg))/(R2*C)". Thus the spread of (vdd−abs(Vthp)) and (vdd−Vsg) can approximately cancel each other out across PVT variations.

The prior function can be approximately simplified as: (Vtrip/I2)*C=1/(R2*C). Therefore a spread of (Vtrip/I2)*C is determined by a spread of R2 and C across PVT. The spread of R2 and C across PVT is about ±20% respectively and therefore, 1/(R2*C) is about 40% across PVT and thus the USB/eUSB timing constraints can be met for a fast enough squelched detection time.

Similarly to meet an un-squelched USB/eUSB detection time, a speed of the input stage, and comparator stage also need to be fast enough. For example, a size of MN1 and MN2 is set to be strong enough to discharge C when either out_a 534 or out_b 538 toggles to high. Either MP5 or MP6 is turned off to shut down I2 when either out_a 534 or out_b 538 toggles to high. In some example embodiment, MP5, MP6 can be removed if MN1, MN2 are designed to be strong enough because the current from MP4 can be drained by MN1 or MN2 if MN1, MN2 are strong.

Figure 7:
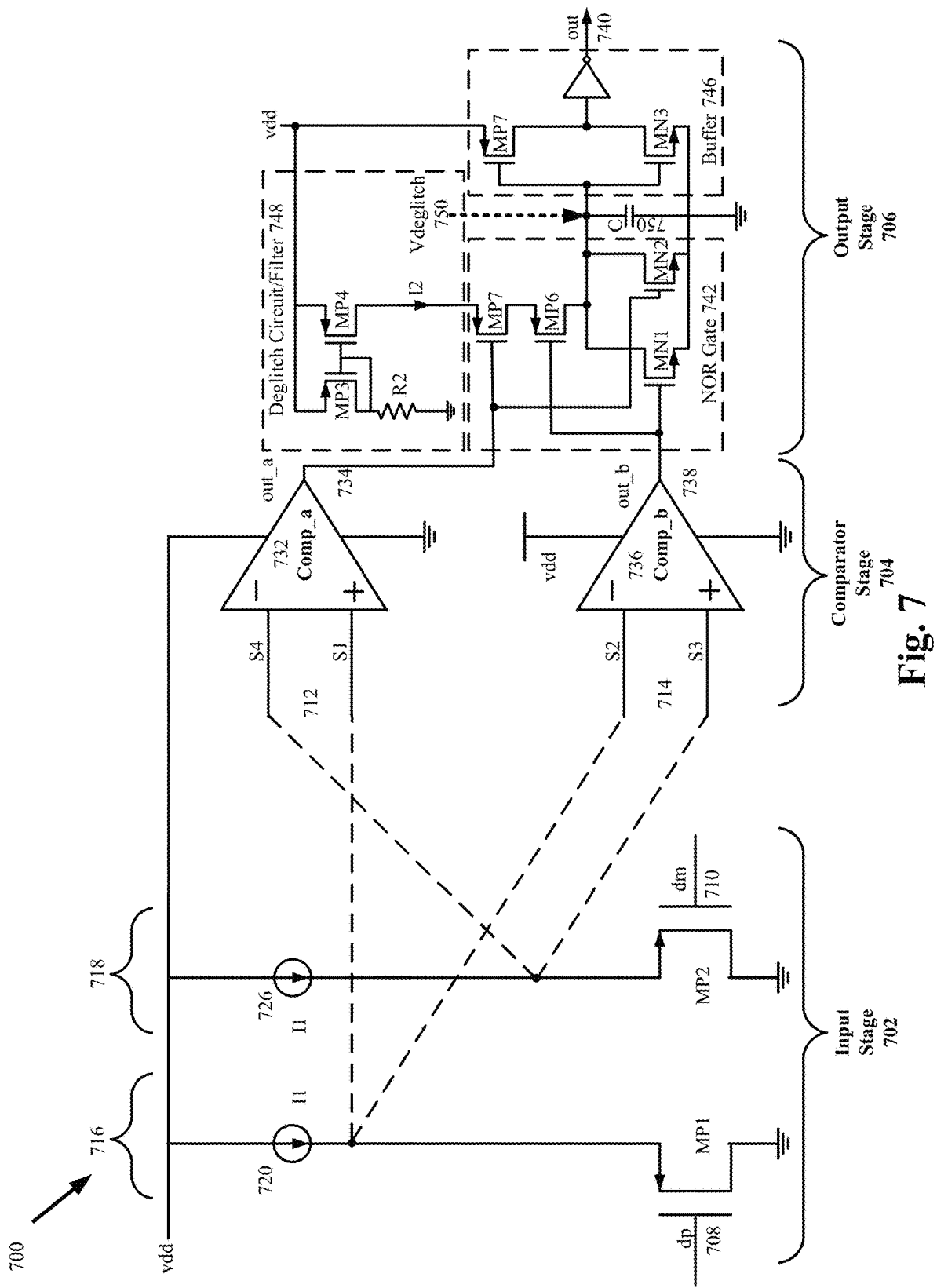
FIG. 7 is a second example differential-signal-detection circuit including a deglitch circuit.

FIG. 7 is a second example 700 differential-signal-detection circuit including a deglitch circuit 748. The second example 700 differential-signal-detection circuit is substantially the same as the first example differential-signal-detector circuit 500, except that R1 resistances 524 and 530 have been deleted. Glitches are avoided in a same manner as that discussed with respect to FIGS. 5 and 6.

The differential-signal-detection circuit 700 includes: an input stage 702, a comparator stage 704, and an output stage 710.

The input stage 702 is configured to receive differential input signal 708, 710 (dp (data-plus input) and dm (data-minus input)) and generate a first differential output signal 712 and a second differential output signal 714.

The input stage 702 includes a first path 716 and a second path 718. The first path 716 includes a detection current source (I1) 720 and a transistor (MP1). The second path 718 includes a detection current source (I1) 726 and a transistor (MP2). Transistors MP1 and MP2 are shown as PMOS, but could be NMOS or of another type in a circuit which follows the same design principals.

The comparator stage 704 includes a first comparator 732 configured to receive the first differential output signal 712 and generate a first single-ended output signal 734, and a second comparator 736 configured to receive the second differential output signal 714 and generate a second single-ended output signal 738.

The output stage 706 is configured to receive the first and second single-ended output signals 734, 738 and generate a differential-signal-detection signal at an output 740. The output stage 706 includes a NOR gate 742, a capacitor (C) 744, a buffer 746 and a deglitch circuit 748 (e.g. glitch filter). In some example embodiments, the output stage 710 buffer 746 is sized for driving additional circuits (not shown), but in other example embodiments may be omitted. A deglitch voltage (Vdeglitch) 750 is defined at the capacitor C 744.

The deglitch circuit 748 includes a current generator that consists of resistor R1 and transistors MP3, MP4. Transistors MP3 and MP4 are current mirror with ratio of "m:n" where "m" and "n" are determined by design. In the calculation, we assume that m=n=1 for simpler discussion, then current "I2=(vdd−Vsg)/R2, where Vsg=abs(Vthp)+sqrt(2*I(μp*Cox*(W/L)))", where pp is a mobility of the transistor, and Cox is a gate oxide capacitance per unit area of the transistor, and W is a channel width while L is a channel length of the transistor.

The example differential-signal-detection circuits including glitch filtering just discussed can in various example embodiments be used as either squelch detectors and/or disconnect detectors for any circuit having differential signals. The circuits can also be used in various USB2 and eUSB applications, as well as in any other communication circuits/standards that need wide range detection threshold programmability. The circuits in some example applications can be used in bi-directional repeaters, logic converters, digital gates, or other signal processing applications by applying a current source and a capacitor.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A differential-signal-detection circuit, comprising:
an input stage configured to receive a differential input signal and to output a first differential output signal and a second differential output signal;
a first comparator coupled to receive both the first differential output signal and the second differential output signal, and in response generate a first comparator output signal;
a second comparator coupled to receive both the first differential output signal and the second differential output signal and generate a second comparator output signal; and
an output stage configured to receive the first and second comparator output signals and generate a differential-signal-detection signal;
wherein the output stage includes a deglitch circuit configured to attenuate changes in the differential-signal-detection signal during an inter-symbol period of the differential input signal.

2. The circuit of claim 1:
wherein the output stage is a digital circuit and the deglitch circuit is configured to prevent changes in the differential-signal-detection signal during the inter-symbol period of the differential input signal.

3. The circuit of claim 1:
wherein the deglitch circuit is configured to generate a current; and
wherein the output stage includes a capacitive circuit configured to be charged by the current when both the first and second comparator output signals are below a first threshold signal level.

4. The circuit of claim 3:
wherein the output stage includes an output configured to carry the differential-signal-detection signal;

wherein a deglitch voltage is defined between the capacitive circuit and the output; and wherein the deglitch voltage is below a second threshold signal level during the inter-symbol period.

5. The circuit of claim 4:

wherein when the deglitch voltage is below the second threshold signal level, then the differential-signal-detection signal is in a first state; and wherein when the deglitch voltage is above the second threshold signal level, then the differential-signal-detection signal is in a second state.

6. The circuit of claim 3:

wherein the deglitch circuit includes a set of transistors configured as a current mirror.

7. The circuit of claim 4:

wherein the output stage includes a NOR gate configured to receive both the first and second comparator output signals and the current from the deglitch circuit.

8. The circuit of claim 7:

wherein the NOR gate is configured to pass the current to the capacitive circuit when both the first and second comparator output signals are below the first threshold signal level.

9. The circuit of claim 3:

wherein a deglitch voltage is defined between the capacitive circuit and the output; and wherein the capacitor is configured to attenuate the deglitch voltage during the inter-symbol period of the differential input signal.

10. The circuit of claim 3:

wherein the output stage includes a NOR gate configured to discharge the capacitive circuit when either of the first and second comparator output signals are above the first threshold signal level.

11. The circuit of claim 1:

wherein the input stage includes a first transistor coupled to receive a first polarity of the differential input signal, and a second transistor coupled to receive a second polarity of the differential input signal;

wherein the input stage includes a first current source coupled to the first transistor a first input of each the first comparator and the second comparator; and wherein the input stage includes a second current source coupled to the second transistor a second input of each the first comparator and the second comparator.

12. The circuit of claim 11:

wherein the input stage includes a first resistance coupled between the first transistor and the first current source; and wherein the input stage includes a second resistance coupled between the second transistor and the second current source.

13. The circuit of claim 12:

wherein the first resistance and the second resistance are variable resistances.

14. The circuit of claim 13:

wherein the first and second resistances are variable in response to a controller signal.

15. The circuit of claim 1:

wherein the differential-signal-detection circuit is embedded in a squelch-detector; and wherein a first state of the differential-signal-detection signal corresponds to an un-squelched state, and a second state of the differential-signal-detection signal corresponds to a squelched state.

16. The circuit of claim 1:

wherein the differential-signal-detection circuit is embedded in a disconnect-detector; and wherein a first state of the differential-signal-detection signal corresponds to a connected state, and a second state of the differential-signal-detection signal corresponds to a disconnected state.

17. The circuit of claim 1:

wherein the differential-signal-detection circuit is embedded in a repeater-circuit; and wherein the differential input signal is either an eUSB or USB signal.

* * * * *